US007012266B2

(12) United States Patent
Jin

(10) Patent No.: US 7,012,266 B2
(45) Date of Patent: Mar. 14, 2006

(54) MEMS-BASED TWO-DIMENSIONAL E-BEAM NANO LITHOGRAPHY DEVICE AND METHOD FOR MAKING THE SAME

(75) Inventor: Sungho Jin, San Diego, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 271 days.

(21) Appl. No.: 10/350,642

(22) Filed: Jan. 24, 2003

(65) Prior Publication Data

US 2004/0036398 A1    Feb. 26, 2004

Related U.S. Application Data

(60) Provisional application No. 60/405,561, filed on Aug. 23, 2002.

(51) Int. Cl.
*H01J 37/065*    (2006.01)

(52) U.S. Cl. .................................. 250/492.2; 250/423 R

(58) Field of Classification Search ............. 250/492.2, 250/492.3, 423; 219/121
See application file for complete search history.

(56) References Cited

U.S. PATENT DOCUMENTS

| | | | |
|---|---|---|---|
| 4,149,076 A | 4/1979 | Albert | 378/98.6 |
| 5,079,112 A | 1/1992 | Berger et al. | 430/4 |
| 5,399,860 A * | 3/1995 | Miyoshi et al. | 250/310 |
| 5,532,496 A | 7/1996 | Gaston | 250/492.22 |
| 5,629,790 A | 5/1997 | Neukermans et al. | 359/198 |
| 5,637,539 A | 6/1997 | Hofmann et al. | 438/20 |
| 5,701,014 A | 12/1997 | Berger et al. | 250/492.22 |
| 5,811,916 A | 9/1998 | Jin et al. | 313/311 |
| 5,904,561 A | 5/1999 | Tseng | 438/643 |
| 5,982,095 A | 11/1999 | Jin et al. | 313/582 |
| 6,028,689 A | 2/2000 | Michalicek et al. | 359/224 |
| 6,062,931 A | 5/2000 | Chuang et al. | 445/24 |
| 6,069,599 A | 5/2000 | Py et al. | 345/74.1 |
| 6,103,305 A | 8/2000 | Friedmann et al. | 427/249.7 |
| 6,124,650 A | 9/2000 | Bishop et al. | 310/40 |
| 6,141,470 A | 10/2000 | Espindola et al. | 385/37 |
| 6,187,604 B1 | 2/2001 | Gilton | 438/20 |
| 6,201,631 B1 | 3/2001 | Greywall | 359/245 |
| 6,283,812 B1 | 9/2001 | Jin et al. | 445/24 |
| 6,297,063 B1 | 10/2001 | Brown et al. | 438/2 |
| 6,297,592 B1 | 10/2001 | Goren et al. | 315/3.5 |
| 6,333,968 B1 | 12/2001 | Whitlock et al. | 378/136 |
| 6,391,670 B1 | 5/2002 | Wells et al. | 438/20 |
| 6,401,526 B1 | 6/2002 | Dai et al. | 73/105 |
| 6,411,020 B1 | 6/2002 | Yaniv et al. | 313/310 |
| 6,465,132 B1 | 10/2002 | Jin | 429/231.8 |
| 6,498,349 B1 * | 12/2002 | Thomas et al. | 250/423 F |
| 6,504,292 B1 * | 1/2003 | Choi et al. | 313/310 |

(Continued)

FOREIGN PATENT DOCUMENTS

EP    1184888    3/2002

OTHER PUBLICATIONS

Zhu et al., "Large current density from carbon nanotube field emitters", Applied Physics Letters, vol. 75, No. 6, Aug. 9, 1999, pp. 873-875.*

(Continued)

*Primary Examiner*—Jack I. Berman

(57) ABSTRACT

In accordance with the present invention, apparatus for performing electron beam lithography on selected portions of a substrate having a resist covered surface comprises a plurality of nanoscale electron emitters for emitting directional beams of electrons and, for each emitter, a directional control element to direct the emitted beam toward the selected portions. In a preferred embodiment the emitters comprise carbon nanotubes, and the directional control elements comprise micro-electro-mechanical disks in a two-dimensional array. In an alternative embodiment the directional control elements are electrodes.

13 Claims, 8 Drawing Sheets

U.S. PATENT DOCUMENTS

| | | | |
|---|---|---|---|
| 6,512,235 B1 * | 1/2003 | Eitan et al. | 250/423 F |
| 6,519,075 B1 | 2/2003 | Carr et al. | 359/291 |
| 6,525,461 B1 | 2/2003 | Iwasaki et al. | 313/495 |
| 6,538,367 B1 | 3/2003 | Choi et al. | 313/309 |
| 6,545,425 B1 | 4/2003 | Victor | 315/169.3 |
| 6,566,704 B1 | 5/2003 | Choi et al. | 257/314 |
| 6,574,026 B1 | 6/2003 | Jin et al. | 359/224 |
| 6,620,640 B1 | 9/2003 | Gilton | 438/20 |
| 6,653,228 B1 | 11/2003 | Choi et al. | 438/637 |
| 6,660,959 B1 * | 12/2003 | Vallance et al. | 219/121.18 |
| 6,664,727 B1 | 12/2003 | Nakamoto | 313/495 |
| 6,673,392 B1 | 1/2004 | Lee et al. | 427/249.1 |
| 6,692,568 B1 | 2/2004 | Cuomo et al. | 117/84 |
| 6,741,019 B1 | 5/2004 | Filas et al. | 313/355 |
| 6,809,465 B1 * | 10/2004 | Jin | 313/310 |
| 2002/0137242 A1 | 9/2002 | Gilton | 438/20 |
| 2002/0146853 A1 | 10/2002 | Karpov et al. | 438/20 |
| 2002/0158354 A1 | 10/2002 | Tuominen et al. | 257/784 |
| 2003/0034244 A1 | 2/2003 | Yasar et al. | 204/192.3 |
| 2003/0071246 A1 | 4/2003 | Grigorov et al. | 252/500 |
| 2003/0096104 A1 | 5/2003 | Tobita et al. | 428/332 |
| 2003/0230753 A1 | 12/2003 | Stecki et al. | 257/89 |

OTHER PUBLICATIONS

Zhu et. al., "Large Current Density from Carbon Nanotube Field Emitters," Applied Physics Letters, vol. 75, No. 6, pp. 873-875 (1999).

Betzig, E. et al., "Near-Field Optics: Microscopy, Spectroscopy, and Surface Modification Beyond the Diffraction Limit", Science, vol. 257, pp. 189-195 (Jul. 10, 1992).

Liu, J. et al., "Fullerene Pipes," Science, vol. 280 pp. 1253-1256 (May 22, 1998).

Li, W.Z. et al., "Large-Scale Synthesis of Aligned Carbon Nanotubes," Science, vol. 274, pp. 1701-1703 (Dec. 6, 1996).

Tans, Sander J. et al., "Individual single-wall carbon nanotubes as quantum wires," Nature, vol. 386, pp. 474-477 (Apr. 3, 1997).

Fan, S. et al., "Self-Oriented Regular Arrays of Carbon Nanotubes and Their Field Emission Properties," Science, vol. 283, pp. 512-514 (Jan. 22, 1999).

Bower, C. et al., "Plasma-induced alignment of carbon nanotubes," Applied Physics Letters, vol. 77, No. 6, pp. 830-832 (Aug. 7, 2000).

Bower, C. et al., "Nucleation and growth of carbon nanotubes by microwave plasma chemical vapor deposition," Applied Physics Letters, vol. 77, No. 17, pp. 2767-2769 (Oct. 23, 2000).

Cheng et al., "Bulk morphology and diameter distribution of single-walled carbon nanotubes synthesized by catalytic decomposition of hydrocarbons", Chem. Physics Letters, vol. 289, p. 602-610 (1998).

Andrews et al., Chem. Physics Letters, "Continuous production of aligned carbon nanotubes: a step closer to commercial realization", vol. 303, pp. 467-474 (1999).

Jessensky, O. et al., "Self-organized formation of hexagonal pore arrays in anodic alumina", Journal of Applied Physics, vol. 72, pp. 1173 (1998).

Li, A.P. et al., Journal of Applied Physics, vol. 84, No. 11 pp. 6023-6026 (1998).

Scott, A.W., Understanding Microwaves, Ch. 12, pp. 282-317 (1993).

Gilmour, Jr., A.S., Microwave Tubes, Chapter 8, "Gridded Tubes", Artech House, pp. 191-313 (1986).

Spindt, C.A. et al., "Field-Emitter-Array Development For High Frequency Operation," J. Vac. Sci., Technol. B, vol. 11, pp. 468-473 (1993).

Kong, Y.C. et al., "Ultraviolet-emitting ZnO nanowires synthesized by a physical vapor deposition approach", Applied Physics Letters, vol. 78, No. 4, pp 407-409 (2001).

Tsai, C.L. et al., "Bias effect on the growth of carbon nanotips using microwave plasma chemical vapor deposition", Applied Physics Letters, vol. 81, No. 4, pp. 721-723 (2002).

Li, Chao et al., "$In_2O_3$ nanowires as chemical sensors", Applied Physics Letters, vol. 82, No. 10, pp 1613-1615 (2003).

Rouse, Ambrosio A. et al., "Field emission from molybdenum carbide", Applied Physics Letters, vol. 76, No. 18, pp. 2583-2585 (2000).

Brodie, I. et al., "Vacuum Microelectronics", Advances in Electronics and Electron Physics, vol. 83, pp. 1-106 (1992)

Rinzler, A.G. et al., "Unraveling Nanotubes: Field Emission from an Atomic Wire", Science, vol. 269, pp. 1550-1553 (1995).

Bower, C. et al., "On-chip vacuum microtriode using carbon nanotube field emitters", Applied Physics Letters, vol. 80, No. 20, pp. 3820-3822 (2002).

de Heer, Walt et al., "A Carbon Nanotube Field-Emission Electron Source", Science, vol. 270, pp. 1179-1180 (1995).

Saito, Yahachi et al., "Field Emission Patterns from Single-Walled Carbon Nanotubes", Jpn., J. Appl. Phys., vol. 36, pp. L1340-L1342, Part 2, No. 10A (1997).

Wang, Q.H. et al., "Field Emission From Nanotube Bundle Emitters at Low Fields", Appl. Phys. Lett. 70 (24), pp. 3308-3310 (1997).

Adachi, H. et al., "Stable carbide field emitter", Appl. Phys. Lett. 43 (7), pp. 702-703 (1983).

Huang, Michael H. et al., "Room-Temperature Ultraviolet Nanowire Nanolasers", Science, vol. 292, pp. 1897-1899 (2001).

Aggarwal, S. et al., "Spontaneous Ordering of Oxide Nanostructures", Science, vol. 287, pp. 2235-2237 (2000).

Luo, Yun et al., "Nanoshell tubes of ferroelectric lead zirconate titanate and barium titanate", Applied Physics Letters, vol. 83, No. 3, pp. 440-442 (2003).

Merkulov, Vladimir I. et al., "Shaping carbon nanostructures by controlling the synthesis process", Applied Physics Letters, vol. 79, No. 8, pp. 1178-1180 (2001).

Teo, KBK et al., "Plasma enhanced chemical vapour deposition carbon nanotubes/nanofibres—how uniform do they grow?", Institute of Physics Publishing, Nanotechnology 14, pp. 204-211 (2003).

Mackie, W.A. et al., "Emission and Processing Requirements for Carbide Films on MO Field Emitters", Mat. Res. Soc Symp. Proc. vol. 509, pp. 173-178 (1998).

Wang, Q.H. et al., "A nanotube-based field-emission flat panel display", Applied Physics Letters, vol. 72, No. 22, pp. 2912-2913 (1998).

Saito, Yahachi et al., "Cathode Ray Tube Lighting Elements with Carbon Nanotube Field Emitters", Jpn. J. Appl. Phys., vol. 37, pp. L346-L348 (1998).

Bonard, Jean-Marc et al., "Field emission from single-wall carbon nanotube films", Applied Physics Letters, vol. 73, No. 7, pp. 918-920 (1998).

Dean, Kenneth A. et al., "Field emission microscopy of carbon nanotube caps", Applied Physics Letters, vol. 85, No. 7, pp. 3832-3836 (1999).

Ren, Z.F. et al., "Synthesis of Large Arrays of Well-Aligned Carbon Nanotubes on Glass," Science, vol. 282, pp. 1105-1107 (Nov. 6, 1998).

* cited by examiner

MEMS-BASED TWO-DIMENSIONAL E-BEAM NANO LITHOGRAPHY DEVICE AND METHOD FOR MAKING THE SAME

CROSS REFERENCE TO RELATED APPLICATION

This application claims the benefit of U.S. Provisional Application Ser. No. 60/405,561 filed by S. Jin on Aug. 23, 2002, which application is incorporated herein by reference.

FIELD OF INVENTION

The present invention relates to lithography and, in particular, to electron beam lithography utilizing micro-electro-mechanical-systems (MEMS) devices. The invention is particularly useful in nanoscale lithography.

BACKGROUND OF THE INVENTION

Nanoscale fabrication technologies are crucial for construction of new nanoscale devices and systems as well as for manufacturing the next generation of higher-density semiconductor devices. Conventional e-beam lithography with single-line writing is inherently slow and costly. Projection e-beam lithography technology, sometimes called SCALPEL, is disclosed in Berger et al., U.S. Pat. Nos. 5,701,014 and 5,079,112 and in Gaston, U.S. Pat. No. 5,532,496. Projection e-beam lithography can expose about 1 $cm^2$ in an exposure time of <1 second, but it is too slow for manufacturing. The technique also requires special stencil masks and has a relatively poor resolution of several tens of nanometers.

Two-dimensional, x-y addressable array of electron field emission sources include the cold tip cathode array by C. A. Spindt, C. E. Holland, A. Rosengreen, and I. Brodie in "Field emitter array development for high frequency operation," *J. Vac. Sci. Technol. B*, vol. 11, pp. 468–473, 1993 and the nanotube field emission display cathodes described by W. B. Choi, et al., in "Carbon-Nanotube Based Field-Emission Displays for Large Area and Color Applications", *Journal of Information Display*, Vol. 1, No. 1, p. 59, December 2000. In theory, such arrays may be used to achieve simultaneous e-beam writing. However, it would be impractical to make each cold cathode structure sufficiently small (on the order of ~10 nanometers) to achieve the resolution of the current e-beam lithography. Even if such a nanoscale cathode structure could be fabricated, the number of cathode cells and associated lead wires required for x-y addressing would be astronomical. To carry out two-dimensional e-beam lithography on a 12 inch diameter wafer, it would take ~$10^{14}$ cathodes and wire connections. Accordingly there is need for a new lithography approach which can pattern a wider area with higher throughput and higher resolution.

SUMMARY OF THE INVENTION

In accordance with the present invention, apparatus for performing electron beam lithography on selected portions of a substrate having a resist covered surface comprises a plurality of nanoscale electron emitters for emitting directional beams of electrons and, for each emitter, a directional control element to direct the emitted beam toward the selected portions. In a preferred embodiment the emitters comprise carbon nanotubes, and the directional control elements comprise micro-electro-mechanical disks in a two-dimensional array. In an alternative embodiment the directional control elements are electrodes.

BRIEF DESCRIPTION OF THE DRAWINGS

The nature, advantages and various additional features of the invention will appear more fully upon consideration of the illustrative embodiments now to be described in detail with the accompanying drawings. In the drawings.

It is to be understood that the drawings are for purposes of illustrating the concepts of the invention and are not to scale.

DETAILED DESCRIPTION OF THE INVENTION

The present invention provides a micro-electrical-mechanical system (MEMS) arrangement to bring up the cathode cell size to a more practical range while maintaining the ~10 nm scale resolution in two-dimensional e-beam writing, The lithography apparatus is comprised of subdivided MEMS cells. A movable MEMS component in each MEMS cell is actuated, e.g., electrostatically or magnetically, to tilt/rotate three-dimensionally so that the electron trajectory from a nanoscale field emitter attached to it (e.g., nanowire or nanotube cold cathode) can be scanned over the entire cell area, e.g., 10 micrometer diameter of square area. By nanoscale emitter is meant an emitter having extents of less than a micrometer in at least two of the three dimensions.

Figure 1:
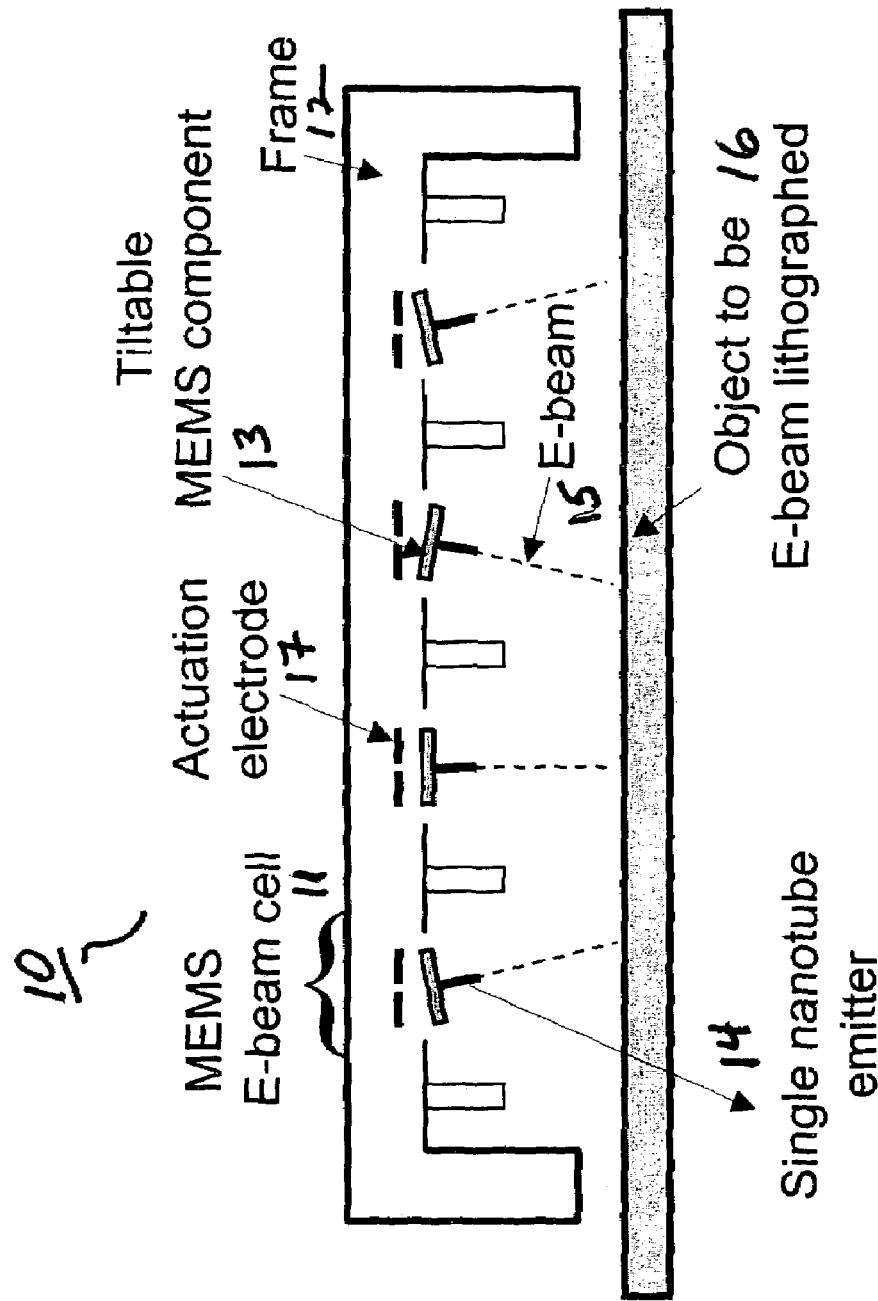
FIG. 1 is a schematic illustration of an exemplary two-dimensional electron beam lithography apparatus according to the invention.

Referring to the drawings, FIG. 1 schematically illustrates an exemplary e-beam lithography apparatus 10 comprising an array of MEMS cells 11 within a frame 12. Each cell 11 contains a movable and scannable component 13 with a single electron field emitter 14 for emitting an electron beam 15. The object to be lithographed, such as a thin coating 16 of resist material, is, after exposure to the e-beam, chemically etched to develop a nanoscale patterned structure. An exemplary useful resist material is PMMA (polymethylmethacrylate). Alternatively, instead of using the resist material, the scanning e-beams may be allowed to directly bombard a thin metal or ceramic film so that melting and ablation of the material generates a trench or a hole patterned structure.

The movable disk 13 can be of any shape (e.g., circular, square, or triangular). The tilting of movable disk 13 in each cell, and hence the trajectory of field emitted electrons from the nano emitter 14 attached on the movable disk, is controlled to any desired angle by applying a varying intensity of electric fields to electrodes 17 located adjacent the disk. Such a technology for tilting MEMS movable components has been established in recent years. See U.S. Pat. No. 6,201,631 by Greywall (Mar. 13, 2001), U.S. Pat. No. 6,028,689 by Michalicek et al. (Feb. 22, 2000), and U.S. Pat. No. 5,629,790 by Neukermans et al. (Mar. 13, 1997), all three of which are incorporated herein by reference.

The preferred electron emitters 14 are carbon nanotubes. Carbon nanotubes are powerful electron field emitters (See Zhu, et al, "Large Current Density from Carbon Nanotube field Emitters", *Applied Physics Letters*, Vol.75, No. 6, p. 873, August 1999). The electrons emitted from the tips of carbon nanotubes are utilized, according to this invention, for the two-dimensional e-beam lithography. Since the field emission of electrons is most effective in vacuum where collisions with atoms or ions are minimized, the lithography apparatus is preferably operated at a vacuum level typically used for field emission display.

The MEMS structure illustrated in FIG. 1 can be fabricated by using surface micro-machining such as the MUMPS processing system (Multi User MEMS Processing System), by bulk micro-machining such as the SOI (silicon-on-insulator) process, or by the LIGA process (x-ray lithography and electrodeposition). Such MEMS fabrication processes are described in detail in the literature. See, for example: Marc Madou, *Fundamentals of Microfabrication*, CRC Press, New York 1997, and Gregory T. A. Kovacs, *Micromachined Transducers—Source Book*. McGraw Hill, N.Y. 1998. The MEMS structure according to the invention can be made of a number of alternative materials including polysilicon, single crystal silicon, silicon carbide, diamond or metal.

On each movable disk 13 is disposed a single electron field emitter 14 as a source of a scanning e-beam 15. The field emitter 14 is preferably a carbon nanotube, but nanowires, sharp tips such as patterned silicon tips, and emitters of negative electron affinity material such as CVD diamond are not excluded. Carbon nanotubes grown on silicon pyramid tips may also be used. See U.S. Pat. No. 6,401,526 by Dai et al. (Jun. 11, 2002), which is incorporated herein by reference. To maintain high resolution with a minimal waste of space on the device surface, the nano emitter can be grown directly on the surface of the disk 13 by utilizing nano-patterned nucleation (or catalyst) sites. Even a single nanotube is capable of providing emission current density as high as $\sim 10^8$ A/cm$^2$.

Figure 2:
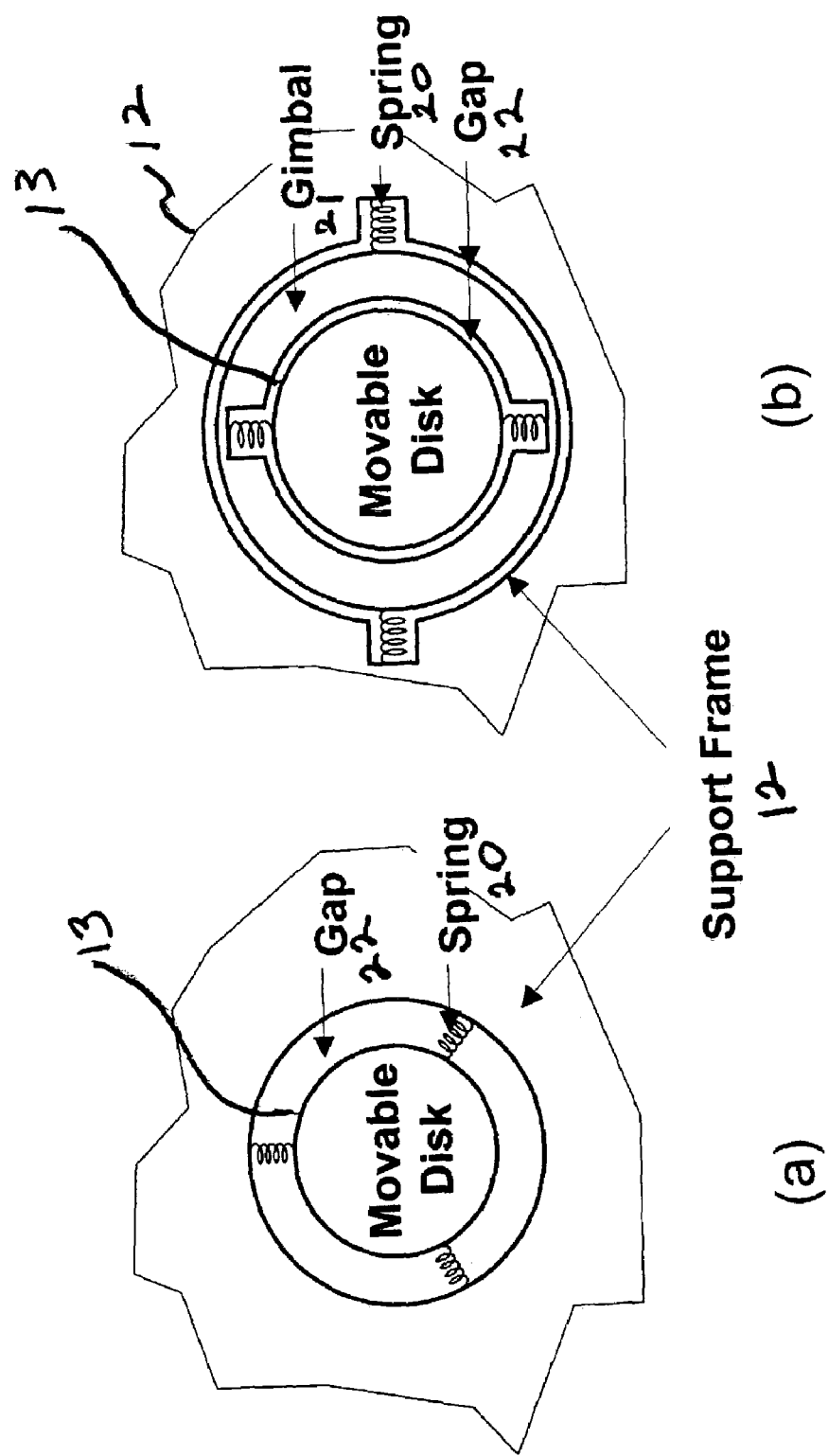
FIGS. 2(a) and 2(b) show an exemplary directional control element comprising a movable disk for directing the trajectory of electrons emitted from an electron emitter.

FIGS. 2(*a*) and 2(*b*) illustrate exemplary tiltable disk structures 13 useful in the apparatus of FIG. 1. In FIG. 2(*a*), the disk 13 is coupled to the frame 12 by resilient elements 20. In FIG. 2(*b*) the disk 13 is resiliently coupled to a movable gimbal 21 which, in turn, is resiliently coupled to frame 12 by springs 20. Gaps 22 separate the disk 13 from the frame 12 and/or the gimbal 21. Other types of tilt/rotate designs such as those using torsional bars can also be used. The movable disk, and hence the pointing direction of the nanotube emitter attached on it, can be tilted toward any direction by independent control of electrostatic potentials applied between the movable disk 13 and electrodes (17 of FIG. 1). Alternatively, instead of electrostatic actuation, magnetic actuation can be used by adding a magnetic layer on the movable disk. Instead of applying a potential (voltage) to electrodes, an electrical current can be applied to solenoids or thin/thick film coils to induce magnetic attraction or repulsion on the movable component. Alternatively, other types of MEMS actuation such as piezoelectric or thermal actuation can be used.

While a simple diode structure consisting of a cathode (e.g., the nanotube field emitter 14) and an anode (the object 16 to be e-beam lithographed) can be adapted, easier control of electron emission is provided by a triode structure including a gate electrode near the cathode. A gate aperture placed near the tip of carbon nanotubes for ease of extracting the electrons, may also be combined with additional electrode layers stacked to serve as optical lenses for e-beam focusing. Either electrostatic or magnetic focusing may be utilized.

Figure 3:
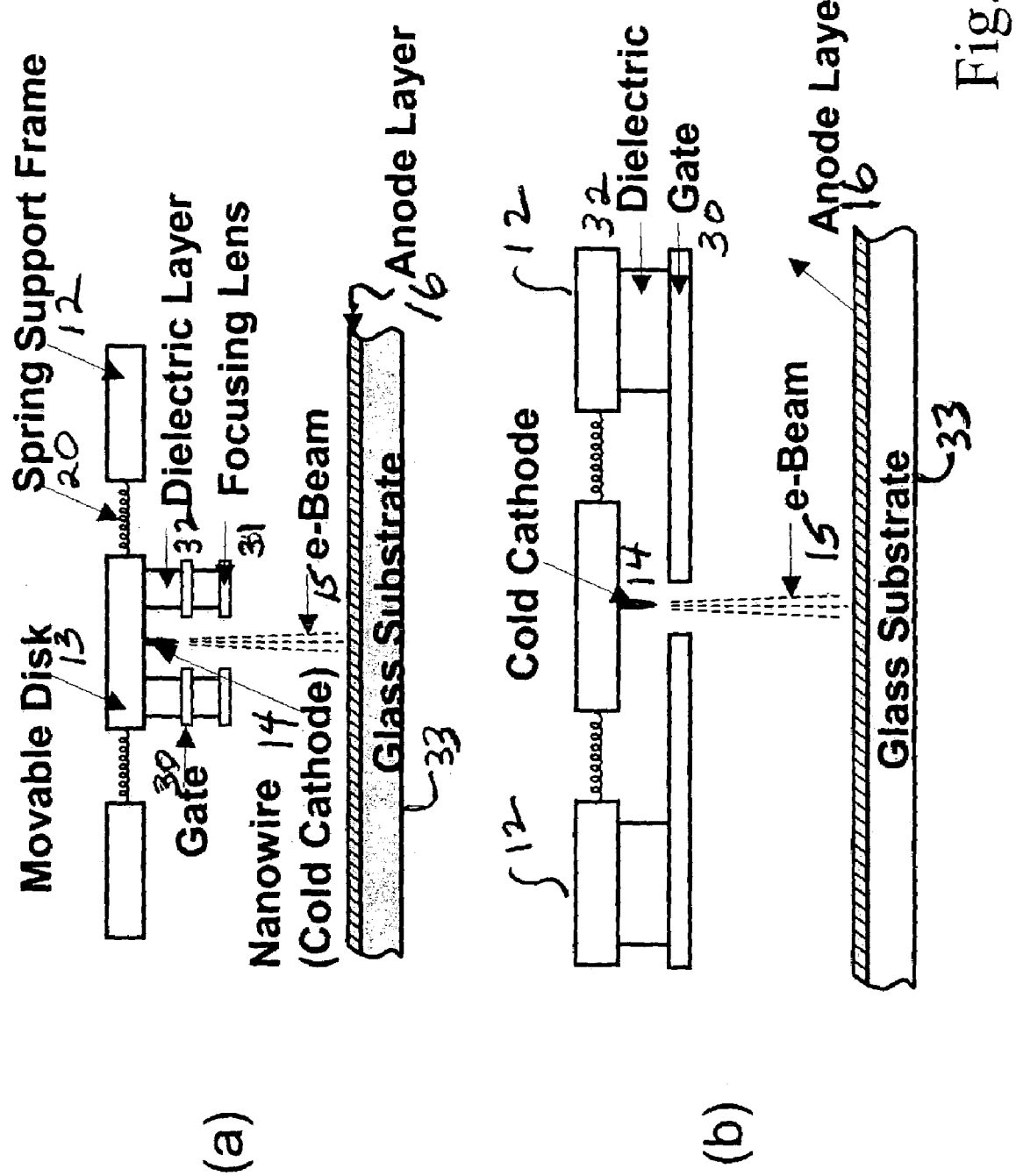
FIG. 3(a) illustrates a two-dimensional e-beam lithography apparatus with an electron-drawing gate and a beam focusing lens placed directly on a movable disk.
FIG. 3(b) illustrates a two-dimensional e-beam lithography apparatus with a gate attached on the support frame of the MEMS structure.

FIGS. 3(*a*) and 3(*b*) illustrate advantageous structures with gates. In FIG. 3(*a*), a gate 30 and a focusing lens 31 are fabricated on spacers 32 of dielectric material. An alternative structure shown in FIG. 3(*b*) is to attach the gate 30 to the support frame 12 instead of the movable disk 13. The latter is advantageous where the angle range of the intended scanning is relatively small, e.g., less than ~10 degrees away from the vertical center line. The layer to be patterned is shown as a layer 16 of e-beam resist on a substrate 33.

The e-beam can also be directed using only electronic controls, without any moving parts. In this alternative embodiment, the gate 30 and/or the focusing lens 31 can be used as a steering electrode to alter the beam direction.

Figure 4A:
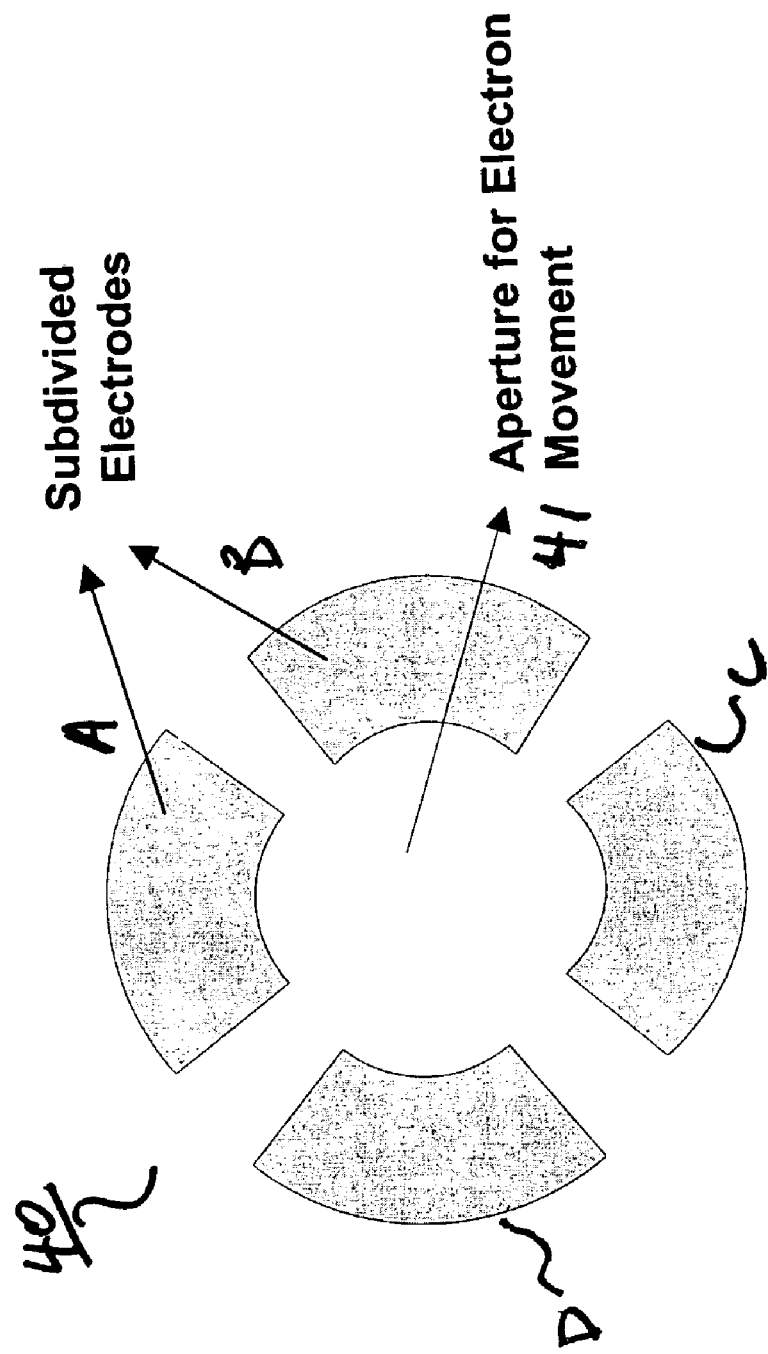
FIG. 4(a) shows an exemplary subdivided electrode.
Figure 4B:
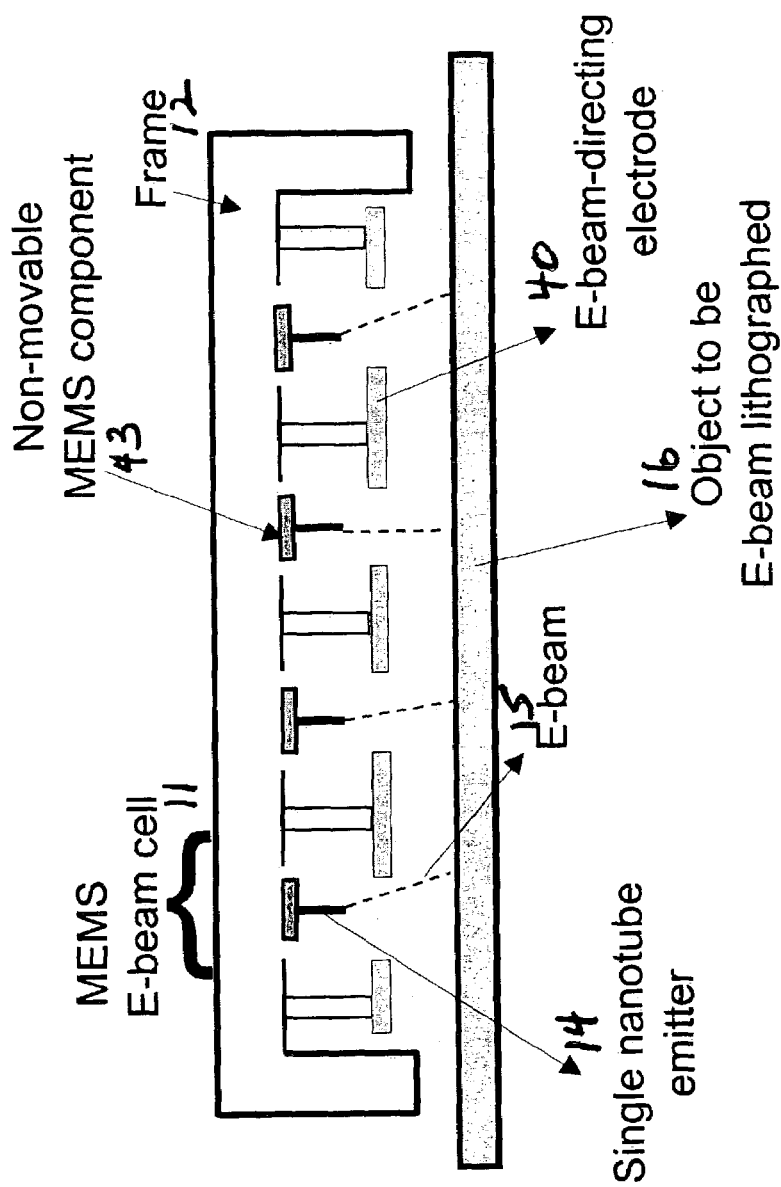
FIG. 4(b) shows a two-dimensional e-beam lithography apparatus for scanning e-beams without moving parts.

FIG. 4(*a*) illustrates a steering electrode 40. By subdividing the gate 30 or focusing lens electrode 31 into independently controllable electrode segments e.g. A, B, C, D and applying asymmetric potentials among the electrode segments, the e-beam can be made to project through aperture 41 toward any selected direction. The electrons move toward the electrode segment with highest applied voltage. The advantage of this approach is elimination of moving components and enhanced long-term reliability.

FIG. 4(*b*) illustrates a lithographic apparatus using stationary emitter supports 43 and e-beam directing electrodes 40.

The preferred field emitter 14 is a single nanotube for each cell 11. The single emitter is preferred to a multiplicity of nanotubes to minimize beam spread and perpendicular momentum. A multiple nanotube configuration, while easier to fabricate than the single nanotube, is likely to complicate the electron optics design because of the spread in energy and momentum. However multiple nanotubes could be used if secondary emission material were placed along the electron path to facilitate focussing.

The desired size of each MEMS cell can be determined based on the needs for high throughput weighed against the complexity of fabricating many small cells. If each of the cells in the proposed two-dimensional e-beam lithography tools is designed as 1 (micrometer)$^2$ in size, the total number of the MEMS cells would be $\sim 10^{11}$. The time required to nano pattern the whole surface of a 12 inch wafer would then be only ~0.01 sec. This is assuming a 10 nm e-beam writing spot size and an exposure time of 1 microsec/spot. If a throughput slower than 0.01 sec/wafer is acceptable, the cell size design can be increased. If one uses a (10 micrometer)$^2$ cell size, which is a more practical and manufacturable dimension, the number of cells on a 12 inch wafer would then be reduced by two orders of magnitude to $\sim 10^9$. This would then take ~1 second to complete e-beam lithography on a 12 inch wafer. Since only a portion of the 12 inch wafer would actually be written, the more realistic estimate of lithography time would be more like ~0.1 second/wafer. Of course, if the cell size is increased further to ~100 micrometer$^2$, it would take ~100 seconds/wafer (or more realistically, ~10 seconds/wafer). Another compromise that can be considered is to build the two-dimensional e-beam lithography tool in a 2 inch$^2$ size, and carry out the nano patterning stepwise on a 2 inch$^2$ areas. With a 10 micrometer$^2$ MEMS cell, this tool can pattern a 12 inch wafer in ~25 seconds.

The inventive two-dimensional e-beam lithography technique can thus provide a high manufacturing throughput without special masks such as those used for projection e-beam lithography. Unlike the projection e-beam lithography, the inventive technique can generate any image on the resist layer material via control of the MEMS cells.

Figures 5A, 5B:
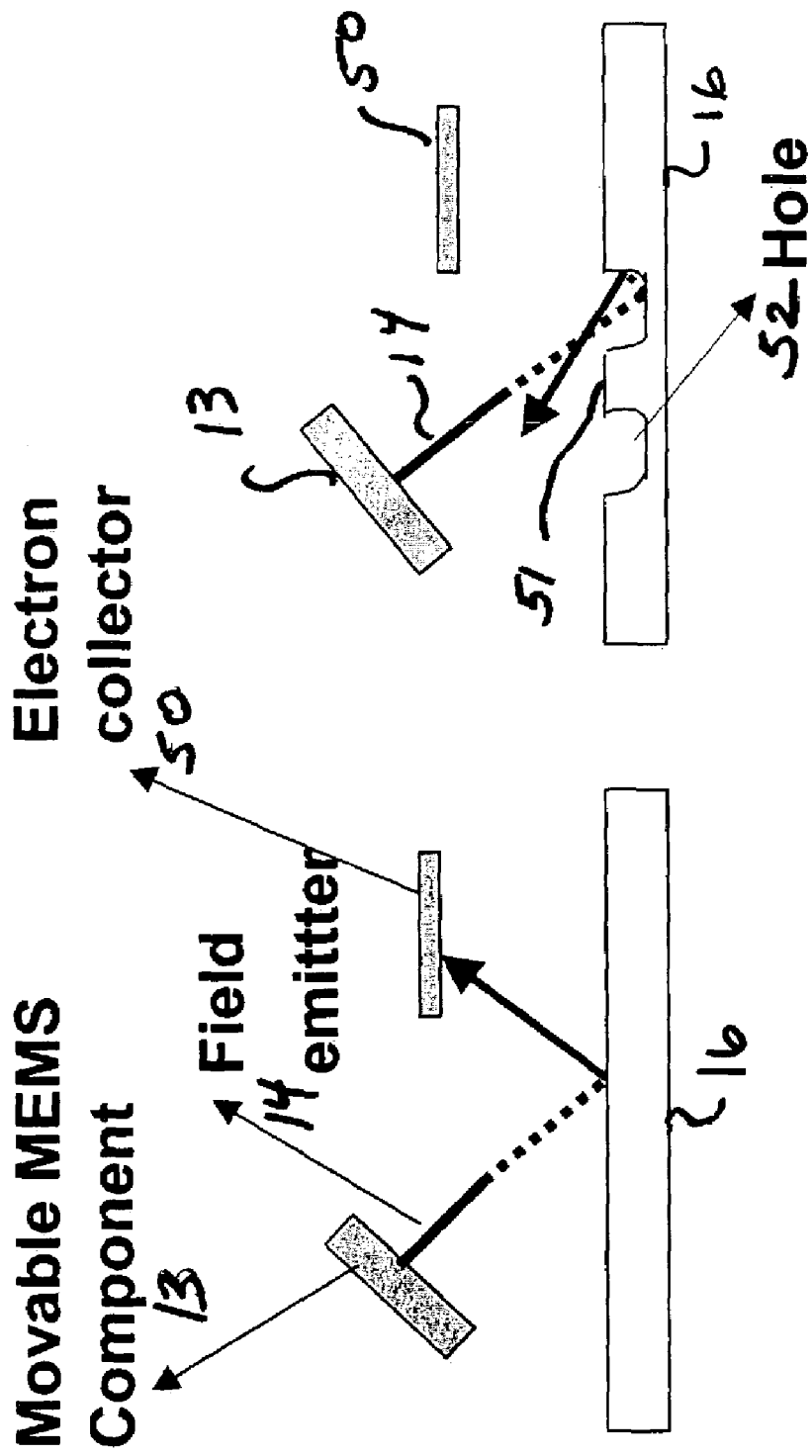
FIG. 5 illustrates an exemplary, ultra-high-density CD ROM reader according to another aspect of the invention.

The e-beam lithography device can also be used as a direct-writing tool on metal, ceramic or polymer substrates. FIG. 5(a) shows a field emitter 14 on a movable disk 13 writing directly on an anode substrate 16. An electron collector 50 is provided for collecting scattered electrons. Because of the two-dimensional, simultaneous write-capability at many beam sites, the speed of information recording can be very high. With e-beam energy sufficient to ablate the material, a permanent hole or groove pattern can be recorded to create ultra-high-density read-only-memory disks for storage of data or information. The desired dimension of such recorded memory bit size is in the range of about 10 nm–100 nm, preferably less than 50 nm, and even more preferentially less than 20 nm. The stored information bits so produced may be read using NSOM (Near-Field Scanning Microscopy) or even using the electron beam itself.

NSOM is a type of microscopy where a sub-wavelength light source is used as a scanning probe. The probe is scanned over a surface at a few nanometers above the surface. The NSOM probe typically has a small aperture on the end of a tapered, aluminum-coated optical fiber. By illuminating a sample with the "near-field" of the light source, optical images can be resolved with resolution well beyond the usual "diffraction limit" (typically about 50 nm). The principles of NSOM microscopy are described in an article by E. Betzig and J. K. Trautman, *Science* 257, 189 (1992).

FIG. 5(b) shows how the apparatus can be used to read a nanoscale patterned ROM disk. The characteristics and intensity of scattered or secondary electrons from smooth spots 51 (corresponding to a "zero" bit) are different from those from a hole 52 (corresponding to a "one" bit). The difference is then detected by sensing the collector electrode 50 electrical current.

Figure 6A:
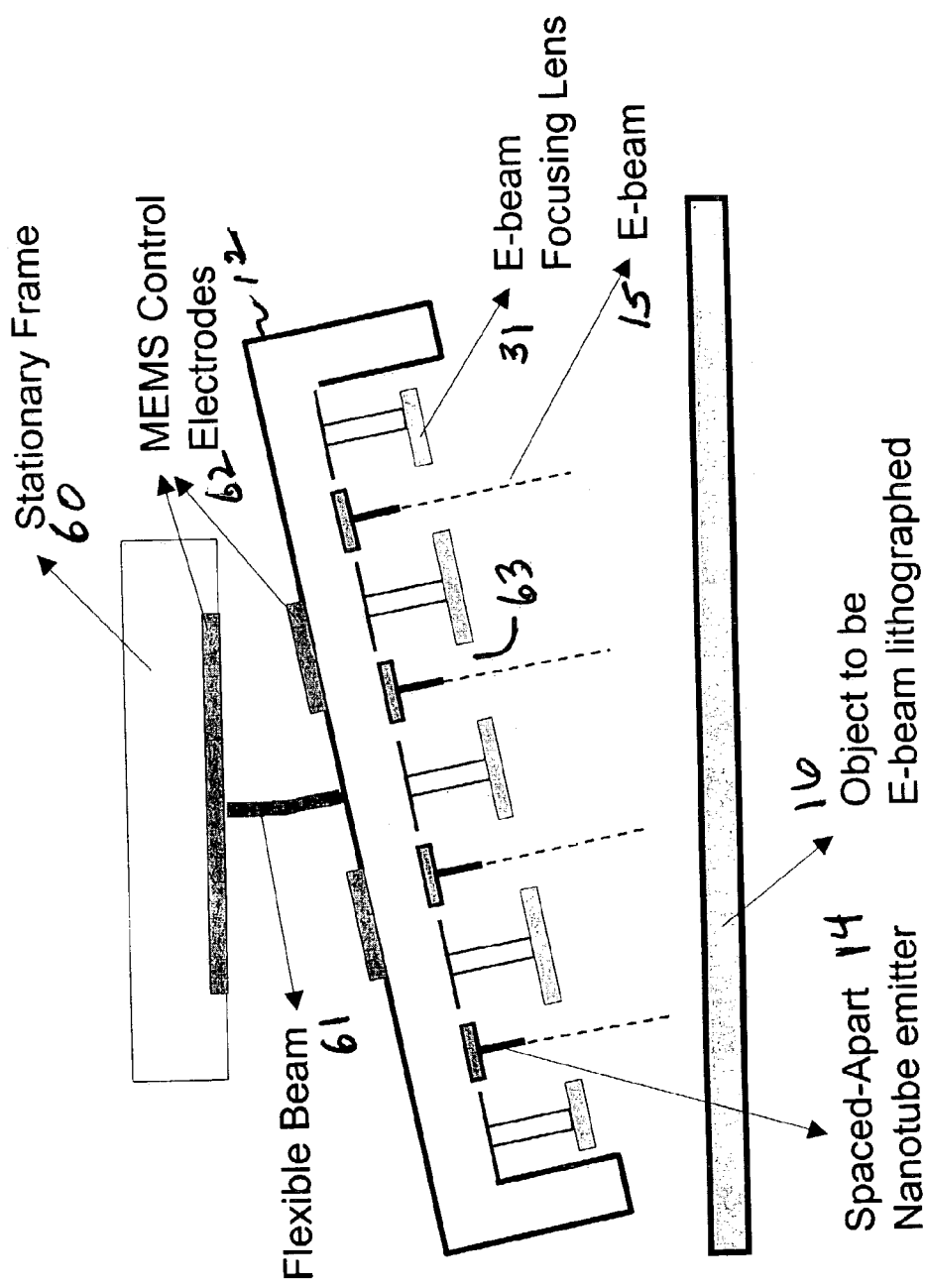
FIGS. 6(a) and 6(b) illustrate alternative embodiments, comprising a group-steerable, MEMS based, two-dimensional electron source array.
Figure 6B:
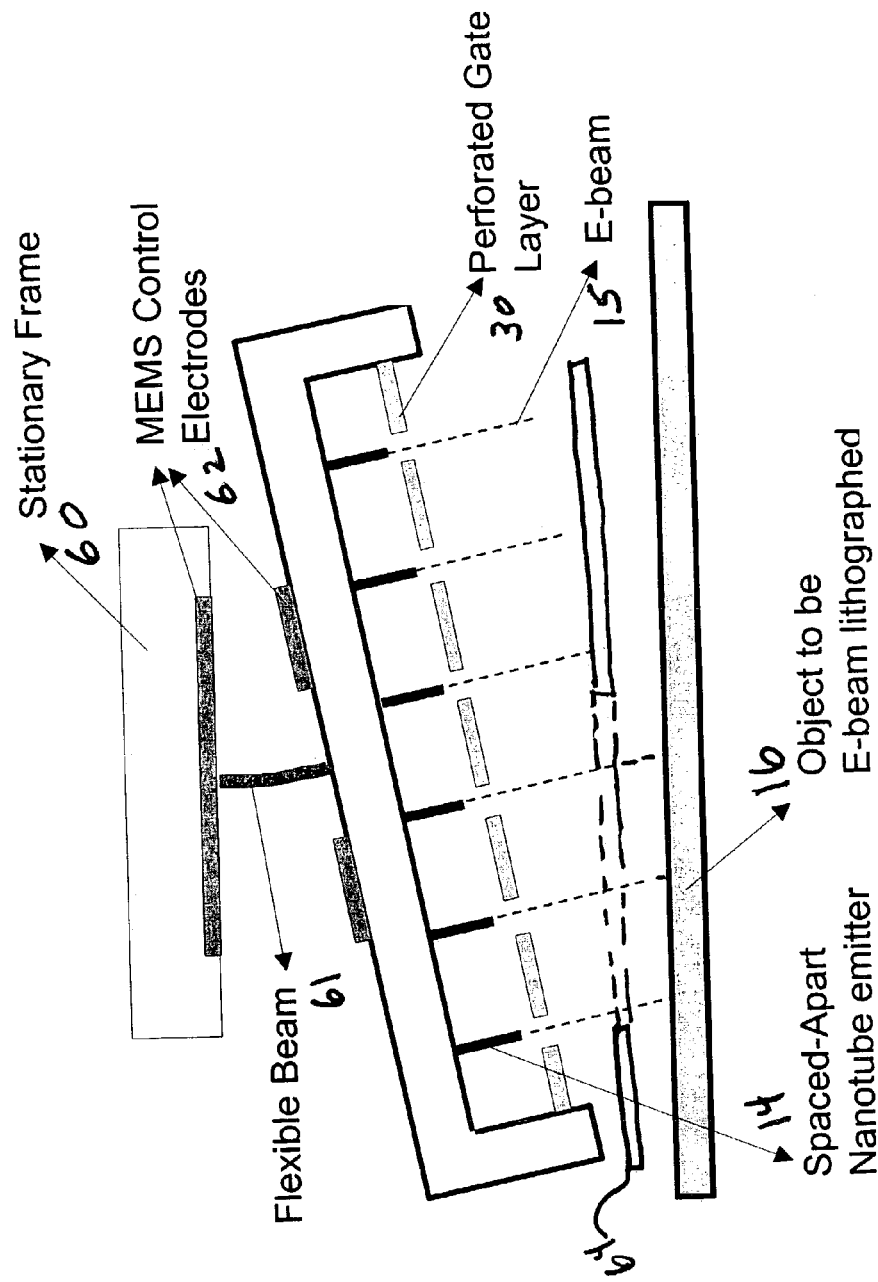

Another application of the e-beam apparatus is scanning an array of e-beam sources together. This is schematically illustrated in FIGS. 6(a) and 6(b). In FIG. 6(a), a group of electron sources are simultaneously steered together to broaden the beam. This steering together is effectuated by attaching frame 12 to a stationary frame 60 via a flexible beam 61. The orientation of the frame 12 can then be controlled by MEMS control electrodes 62. In FIG. 6(b), a multiplicity of field emitters in the same cell are controllable by the same grid and steered as a group. The grid desirably contains apertures 63 (either random or periodic) to efficiently induce emission of electrons from various nanotubes and to allow them to accelerate toward the anode (the substrate or device surface to be irradiated). Such e-beam source tools with configurations of FIGS. 6(a) and 6(b) are convenient for applications where a broader e-beam rather than a single line, focused e-beam is desired, e.g., for projection e-beam lithography (such as SCALPEL) which requires a broad beam to be directed over a pre-patterned mask (e.g. 64 of FIG. 6(b). For example, a group of nanotube emitter units (e.g., 10–10,000 units), each optionally having its own e-beam focusing lenses to make the e-beam more parallel and uniform, can provide a beam diameter of e.g., 0.1–10,000 micrometers. On steering and scanning such a group of nano emitters, the area covered by the electron beam can be increased by a factor of 10–1000 as compared to a single emitter. In a further embodiment of the invention, many such groups of e-beam emitter units, each independently steered by MEMS mechanism, can be operated to pattern an even wider substrate area.

It can now be seen that a device for exposing selected portions of a surface to electrons comprises a plurality of nanoscale electron emitters. By nanoscale is meant that at least two of three dimensions of the emitter are less than a micron. Each emitter is oriented for emitting a directional beam of electrons toward the surface, and a directional control element is associated with each emitter to control the direction of the emitted beam toward the selected portions of the surface. Preferably the nanoscale electron emitters are disposed in a linear or two-dimensional array of MEMS cells.

The directional control element can be a movable support element for a nanoscale emitter. Control of the orientation of the support element controls the direction of the emitted beam. Alternatively, the directional control-element can comprise a plurality of electrodes adjacent an emitter. The voltages applied to respective electrodes control the direction of the beam.

The nanoscale electron emitters can be nanotubes (hollow), nanowires (solid), pointed emitting bodies, or bodies of negative electron affinity material.

In an advantageous embodiment a nanoscale emitter is disposed on a movably mounted MEMS disc, and electrical control controls the orientation of the MEMS disc. The orientation of the MEMS disc can be controlled by electrostatic, magnetic, piezoelectric or thermal actuation.

In an advantageous arrangement for performing electron beam lithography, a device described above exposes selected portions of a surface comprising an electron beam resist. Alternatively, for direct writing lithography, the device exposes a material which is locally melted or ablated by an electron beam.

The invention may also be considered as a method of exposing selected portions of a surface to electrons comprising the steps of providing an array of nanoscale electron emitters, inducing electron beams from one or more of the emitters; and separately controlling the directions of the beams from the emitters to direct the beams to the selected portions of the surface. The beam directions can be controlled by separately controlling the orientations of the nanoscale emitters or by deflecting the individual emitted beams. For a lithographic method, the beams are directed to selected portions of an electron resist layer or to a surface that can be melted or ablated by an electron beam.

It is understood that the above-described embodiments are illustrative of only a few of the many possible specific embodiments which can represent applications of the invention. Numerous and varied other arrangements can be made by those skilled in the art without departing from the spirit and scope of the invention.

What is claimed is:

1. A device for performing electron beam lithography on a surface comprising:
    a plurality of nanoscale electron emitters, each nanoscale electron emitter oriented for emitting a directional beam of electrons toward the surface; and
    associated with each electron emitter, a directional control element comprising a MEMs cell containing a movable component for controlling the direction of the emitter beam toward a selected portion of the surface.

2. The device of claim 1 wherein the nanoscale electron emitters are selected from the group consisting of nanotubes, nanowires, bodies with pointed tips, and bodies of negative electron affinity material.

3. The device of claim 1 wherein the plurality of electron emitters are steered together to broaden the beam coverage area.

4. The device of claim 3 wherein the broadened beam is used together with a pre-set mask for projection e-beam lithography.

5. The device of claim 1 wherein the orientation of the movable support element is controlled by electrostatic, magnetic, piezoelectric or thermal actuation.

6. An arrangement for performing electron beam lithography comprising:
   a surface comprising an electron beam resist; and
   a device according to claim 1 for exposing selected portions of the surface to electrons.

7. An arrangement for performing electron beam lithography comprising:
   a surface comprising an electron beam resist; and
   a device according to claim 1 for exposing selected portions of the surface to electrons.

8. The device of claim 1 wherein the nanoscale electron emitters are arranged in a linear or a two-dimensional array.

9. An electron beam lithography tool comprising:
   (a) a MEMS frame with an array of MEMS cells, each cell containing a movable component;
   (b) a nanoscale electron field emitter disposed on each movable component;
   (c) a gate adjacent each emitter and an anode object to be electron lithographed, whereby an electric field between a gate and the anode generates a beam of electrons toward the anode object; and
   (d) a MEMS actuating mechanism for each cell whereby the movable component in each cell can be tilted to a desired angle and the field emitted electron trajectory can be altered to a desired direction so as to perform electron bombardment exposure at selected locations on the anode object.

10. A method of exposing selected portions of a surface to electrons comprising the steps of:
    providing a plurality of nanoscale electron emitters;
    inducing electron beams from the emitters; and
    separately controlling the directions of the beams using MEMS cells, each cell containing a movable component, to separately control the orientations of the nanoscale emitters to direct the beams to the selected portions of the surface.

11. The method of claim 10 further comprising the step of providing the surface with a layer of electron resist.

12. The method of claim 10 wherein the nanoscale emitters are arranged in a linear or two-dimensional array.

13. A device for performing electron beam lithography on a surface comprising:
    a plurality of nanoscale electron emitters, each nanoscale electron emitter oriented for emitting a directional beam of electrons toward the surface; and
    associated with each electron emitter, a directional control element to control the direction of the emitter beam toward a selected portion of the surface, wherein the plurality of electron emitters are steered together to broaden the beam coverage area, and wherein the broadened beam is used together with a pre-set mask for projection e-beam lithography.

* * * * *